United States Patent [19]

Weichold et al.

[11] Patent Number: 5,093,699

[45] Date of Patent: Mar. 3, 1992

[54] GATE ADJUSTED RESONANT TUNNEL DIODE DEVICE AND METHOD OF MANUFACTURE

[75] Inventors: Mark H. Weichold, College Station; William B. Kinard, Bryan; Wiley P. Kirk, College Station, all of Tex.

[73] Assignee: Texas A & M University System, College Station, Tex.

[21] Appl. No.: 491,558

[22] Filed: Mar. 12, 1990

[51] Int. Cl.$^5$ .................. H01L 29/80; H01L 29/205; H01L 29/06

[52] U.S. Cl. .......................................... 357/22; 357/4; 357/16; 357/15; 357/34; 357/56

[58] Field of Search .................... 357/4, 16, 15, 22, 34, 357/56

[56] References Cited

U.S. PATENT DOCUMENTS

| Re. 29,578 | 3/1978 | Javan | 357/4 |
|---|---|---|---|
| 3,272,989 | 9/1966 | Sekely | 357/23.1 |
| 4,575,924 | 3/1986 | Reed et al. | 357/4 |
| 4,581,621 | 4/1986 | Reed | 357/4 |
| 4,814,837 | 3/1989 | Kirchoefer | 357/56 |
| 4,907,045 | 3/1990 | Ando | 357/4 |

OTHER PUBLICATIONS

*Solid State Tech.* Nov. 1989 Bate pp. 101-108, "Nanoelectronics".
*IEEE Spectrum* Nathan et al, pp. 45-47 Feb. 1986.
*Appl. Phys. Letts* 50(14) Apr. 6, 1987, Capasso, et al, "Resonant ... Wells", pp. 930-932.
*Appl. Phys. Lett.* 51(7) Aug. 17, 1987 Capasso et al, "Negative ... Transistor" pp. 526-528.
*Appl. Phys. Letts.* 52(5) Feb. 1, 1988 "Quantum Well Tunnel Triode" pp. 398-400, Katalsky et al.
*Apply. Phys. Lett.* 54(11) Mar. 13, 1989 "Realization in Transitor" pp. 1034-1035, Reed et al.
*Apply. Phys. Lett.* 54(12) Mar. 20, 1989 "Novel in epitaxy" Yarn et al, pp. 1157-1159.

*Apply. Phys. Lett.* vol. 55 No. 26, Dec. 25, 1989 pp. 2742-2744 Neu ... "Transconductance" Yang et al.
Houten et al., "Submicron Conducting Channels Defined by Shallow Mesa Etch in GaAs-AlGaAs Heterojunctions", App. Phys. Lett. vol. 49, No. 26 (Dec. 29, 1986), pp. 1781-1783.
Choi et al., "Experimental Determination of the Edge Depletion Width of the Two-Dimensional Electron Gas in GaAS/Al$_x$Ga$_{1-x}$As," Appl. Phys. Lett. vol. 50, No. 2 (Jan. 12, 1987), pp. 110-112.
M. Nathan and M. Heiblum, "A Gallium Arsenide Ballistic Transistor?", IEEE Spectrum, pp. 45-47 (Feb. 1986).
A. Kastalsky and M. Milshtein, "Quantum Well Tunnel Triode", Appl. Phys. Lett. vol. 52, No. 5, pp. 398-400 (Feb. 1, 1988).
Robert T. Bate, "Nanoelectronics", *Solid State Technology*, pp. 101-108 (Nov. 1989).

*Primary Examiner*—Jerome Jackson, Jr.
*Attorney, Agent, or Firm*—Arnold, White & Durkee

[57] ABSTRACT

A gated resonant tunneling diode has a semiconductor mesa formed on a semiconductor substrate, a tunneling barrier layer between the mesa and the substrate, and a gate layered over the substrate about the mesa and aligned in close proximity to the tunneling barrier layer. A control voltage on the gate laterally constricts a potential well in the tunneling barrier to control the electrical size of a channel within which tunnelling occurs across the tunneling barrier layer. Preferably the gate and the tunneling layer are disposed at the base of the mesa, and the gate makes a rectifying Schottky junction in connection with the tunneling barrier layer. The device is constructed using an anisotropic etch to form the mesa with an undercut wall and a top portion overhanging the undercut wall, and a nonconformal deposition of gate material to align the gate with the top portion of the mesa.

15 Claims, 5 Drawing Sheets

GATE ADJUSTED RESONANT TUNNEL DIODE DEVICE AND METHOD OF MANUFACTURE

The United States Government may have rights with respect to the invention pursuant to a funding arrangement with the National Science Foundation.

BACKGROUND OF THE INVENTION

1. Field of the Invention

The present invention generally relates to microelectronic devices, and more particularly to such devices having features on the order of a quarter of a micron or less, and switching times on the order of a picosecond or less. In particular, the present invention concerns the construction of devices employing resonant tunneling.

2. Description of the Background Art

Improvements in the processing of conventional integrated circuits has permitted the fabrication of devices having features on the order of about a quarter of a micron. Without cryogenic cooling, further downsizing of conventional bipolar and field-effect transistors results in excessive temperature rises causing unacceptable degradation of performance. Although further improvements in processing and materials may lower the practical limits on the size of integrated circuit devices, it is anticipated that future integrated circuit development will require unconventional devices that employ different principles of operation.

One principle of operation under investigation for future integrated circuits is resonant tunneling. Resonant tunneling is the operating principle of the well-known resonant tunnel diode. Because tunneling occurs through a potential barrier having a very narrow width, the frequency response of a resonant tunneling device is not limited by the diffusion or transit time of charge carriers. Instead, the frequency response is limited by the circuit capacitance and impedance of the device. The circuit capacitance and device impedance both scale directly with the area of the circuits and devices on the integrated circuit substrate, permitting devices to be down-sized to about the width of the potential barrier.

Tunnel diodes, however, have not been particularly useful for integrated circuit applications, primarily because the tunnel diode is a two-terminal device, and the current-voltage characteristic of the tunnel diode is dictated rather rigidly by the properties of the semiconductor material used in constructing the tunnel diode.

More recently it has become known to use molecular beam epitaxy (MBE) to grow atomically thin layers of single crystal material on a semiconductor substrate to construct tunnel barriers permitting one to engineer a device having a desired current-voltage characteristic. In particular, one may easily select the width of the barrier to adjust the tunneling current, and one may construct an array of barriers in series to increase the "peak" and "valley" voltages of the current-voltage characteristic. This ability to engineer the physical structure of the tunneling barriers provides a high degree of design flexibility quite independent of the properties of the semiconductor material used for fabricating the resonant tunneling device.

Currently researchers have turned their attention to providing a resonant tunneling diode with third control terminal called the gate, resulting in a gated resonant tunneling diode (GRTD), which can also be referred to as a resonant tunneling transistor or triode. Experimental devices and proposed designs have been similar to conventional integrated circuit planar transistors. In these devices the base or channel of the transistor includes the tunneling barrier. But the manufacturing process is rather complicated, and it is difficult to align the gate with the base or channel.

SUMMARY OF THE INVENTION

The primary object of the present invention is to provide a gated resonant tunneling diode having a self-aligned gate.

Another object of the present invention is to provide a gated resonant tunneling diode in which the tunneling current is modulated by an electric field from the gate.

Yet another object of the present invention is to provide a configuration for a gated resonant tunneling diode that enables the construction of compact logic circuits.

Briefly, in accordance with a basic aspect of the present invention, a gated resonant tunneling diode has a gate receiving a control voltage that laterally constricts a potential well in a tunneling barrier to control the electrical size of a channel within which tunneling occurs across the tunneling barrier.

In a preferred embodiment of the invention, a gated tunnel diode includes a semiconductor mesa formed on a semiconductor substrate, a tunneling barrier layer between the mesa and the substrate, and a gate layered over the substrate about the mesa and aligned in close proximity to the tunneling barrier layer. Preferably the gate and the tunneling layer are disposed at the base of the mesa, and the gate makes a rectifying Schottky junction in connection with the tunneling barrier layer. The electric field from the gate causes lateral depletion and constriction of the conduction channel including the tunneling barrier, so that the electric field modulates the tunneling current.

The device is constructed using an anisotropic etch to form the mesa with an undercut wall and a top portion overhanging the undercut wall, and a nonconformal deposition of gate material to align the gate with the top portion of the mesa.

The process can be used to fabricate devices on the nanometer scale which operate at much higher speeds and lower power dissipation than conventional integrated circuits. The process, for example, could be used to construct vertical logic devices with multiple gates and active loads. By using semiconductor materials that have a suitable bandgap in the heterostructure, a variable gain photonic device could also be made which allows incident light to excite carriers from a hidden level to a resonant conducting level. Because an electric field is used to modulate the quantum tunneling process, the devices should operate in the tetrahertz range in such applications as high-frequency oscillators, mixers, detectors, very-high density memory elements and logic elements, and high-speed analog-to-digital converters.

BRIEF DESCRIPTION OF THE DRAWINGS

Other objects and advantages of the invention will become apparent upon reading the following detailed description and upon reference to the drawings in which.

While the invention is susceptible to various modifications and alternative forms, specific embodiments thereof have been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DESCRIPTION OF THE PREFERRED EMBODIMENTS

Figure 1:
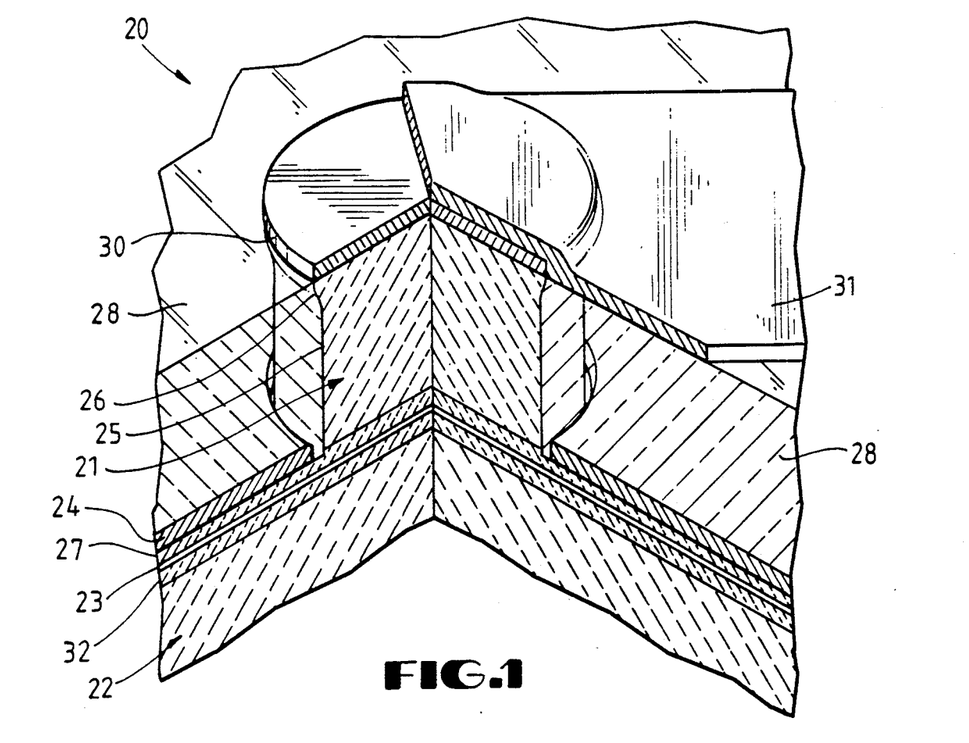
FIG. 1 is a schematic cutaway view of a vertical, gated resonant tunneling diode (GRTD) in accordance with the invention.

Turning now to FIG. 1, there is shown a schematic cutaway view of an experimental gated resonant tunneling diode (GRTD) generally designated 20 that was fabricated in accordance with the present invention. The GRTD 20 has a vertical resonant tunnel diode structure including a semiconductor mesa 21 formed on a semiconductor substrate 22. The mesa 21 is separated from the substrate by a tunneling barrier layer 23 on the substrate. Both the substrate 22 and the mesa 21 are doped with impurities to form a unipolar structure so that the transfer of current across the tunneling barrier occurs by the tunneling of majority carriers. This ensures that the frequency response of the GRTD will not be limited by minority carrier storage effects.

To control the tunneling current through the tunneling barrier 23, a gate 24 is layered over the substrate 22 about the mesa 21 and aligned in close proximity to the tunneling barrier 23. Preferably the gate 24 controls the electrical size or area of the tunneling barrier across which majority carriers may pass. In other words, a control voltage on the gate 24 radially constricts the active area of the tunneling barrier, forming a channel for the conduction of majority carriers across the barrier. In this case the GRTD 20 is more precisely described as a resonant tunneling field-effect transistor. A field-effect mode of operation is preferred because control of tunneling through the barrier 23 in response to a control voltage and electric field from the gate 24 is faster that the injection of current into the tunneling barrier which involves minority carrier storage effects. But for control by a field effect, it is desirable to place the gate 24 as close as possible to the channel area of the barrier layer between the mesa 21 and the substrate 22 so as to maximize the electric field impressed upon the tunneling barrier by the control voltage on the gate.

The problem of aligning the gate 24 with the tunneling barrier layer under the mesa 21 is solved by using an anisotropic etch to form the mesa with an undercut wall 25 and a top portion 26 overhanging the undercut wall, and by using a nonconformal deposition of gate material to align the gate with the top portion of the mesa.

By forming a Schottky metal-semiconductor junction with the gate 24, a field-effect mode of operation is achieved and the gate is isolated from the mesa 21 and the substrate 22. Moreover, the problem of etching the substrate to precisely the depth of the tunneling barrier layer is made less difficult by forming the Schottky junction between the gate 24 and an undoped or intrinsic layer 27 disposed over the tunneling barrier 23. This intrinsic layer also helps prevent shorting or leakage between the gate 24 and the base of the mesa 21. Shorting or leakage between the gate 24 and the mesa 21 is also prevented by a conformal coating of planarized polyimide insulation 28.

To make a drain connection to the top of the mesa 21, ohmic contact material 30 is deposited upon the top of the mesa 21 before the deposition of the gate material. Finally, the gate material is etched off of the top of the mesa 21 and a metal contact pad 31 is deposited over the ohmic contact material 30 and the polyimide insulation 28.

Figure 2:
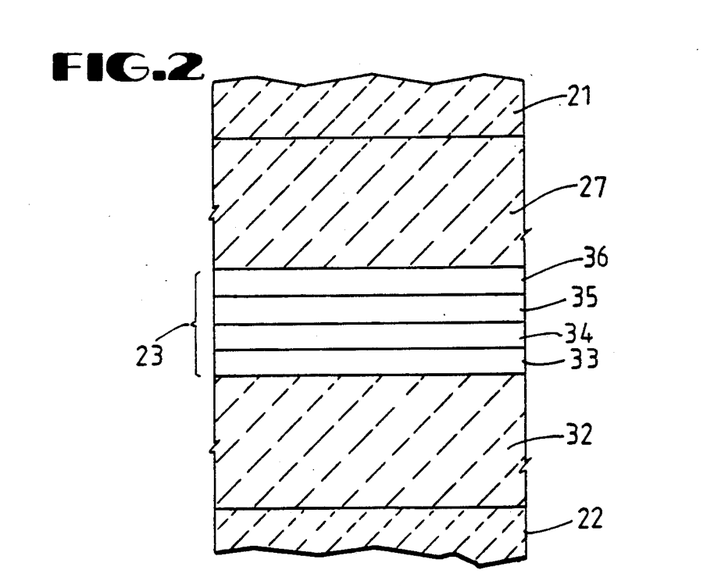
FIG. 2 is a detailed cross-sectional view of the tunneling barrier heterostructure in the GRTD of FIG. 1.

Turning now to FIG. 2, there is shown a detailed view of the tunneling barrier layer 23 which is defined by various layers of molecular beam epitaxially grown material disposed between the doped substrate 22 and the doped mesa 21. In an experimental device, the substrate 22 was n+ gallium arsenide (GaAs with doping of about $2 \times 10^{18}$ cm$^{-3}$), and the layers consisted of 250Å of GaAs 32 (Si doped and graded from $2 \times 10^{18}$ cm$^{-3}$ to approximately $10^{16}$ cm$^{-3}$), A 50Å undoped Al$_{0.3}$Ga$_{0.7}$As barrier 33, a 50Å undoped GaAs well layer 34, a 50Å undoped Al$_{0.3}$Ga$_{0.7}$As barrier 35, a 50Å undoped GaAs spacer 36, the 250Å of GaAs 27 (Si doped and graded from $10^{16}$ to $2 \times 10^{18}$ cm$^{-3}$), followed by the mesa 21, consisting of 0.5 μm n+ —GaAs ($2 \times 10^{18}$ cm$^{-3}$). Although the experimental device used gallium arsenide-based semiconductor materials, other material systems could be used for practicing the invention. A double-barrier arrangement, for example, could be constructed using silicon-based semiconductor materials by depositing silicon over a layer of cobalt silicide deposited on a silicon substrate, to form a Si/CoSi$_2$/Si double barrier.

Figure 3A:
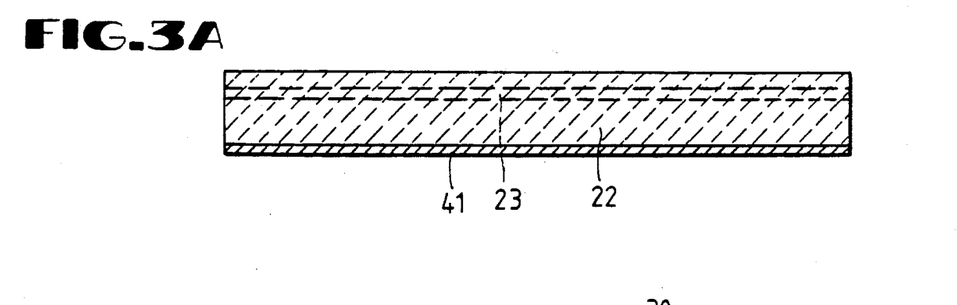
FIGS. 3A to 3E are cross-sectional views illustrating a series of processing steps for fabricating the GRTD of FIG. 1.
Figure 3B:
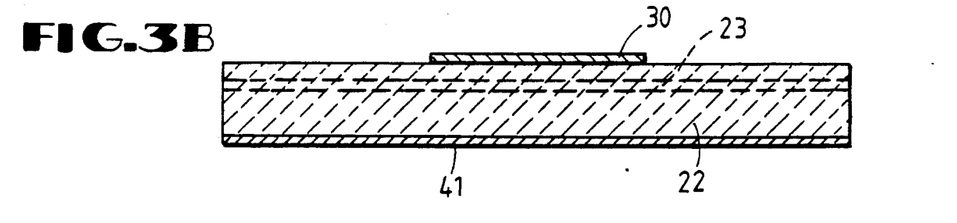

FIG. 3A to FIG. 3E summarizes the processing steps used to fabricate the experimental GRTD (21 in FIG. 1). Molecular beam epitaxy (MBE) was used to grow a double-barrier heterostructure on the GaAs substrate 22 as shown in FIG. 2 and FIG. 3A. The substrate 23 also had an ohmic back 41 of AuGe/Ni. Then, as shown in FIG. 3B, image reversal contact photolithography and liftoff metallization was used to produce arrays of AuGe/Ni dots 30 of various sizes on the surface of the wafer. These metal dots served three purposes: (a) drain ohmic contact, (b) reactive ion etch mask, and (c) shadow mask for the deposition and alignment of the gate (24 in FIG. I).

Both image reversal contact-photolithography and liftoff metallization were used to define and deposit the circular metal structures 30 on the wafer's surface. For the image reversal photolithography, positive AZ 5214E photoresist was spun to a thickness of 1.5 μm, soft baked, and exposed in a Karl Suss MJB-3 (365 nm) contact exposure system. Reversal of the mask image in the photoresist occurred after a post exposure bake followed by a flood exposure before development. The high contrast undercut images in the photoresist aided the liftoff of unwanted metal. The patterning and exposure steps resulted in arrays of metal circles 30 with the following diameters: 2 μm, 4 μm, and 6 μm. The deposited metal layers 30 consisted of 950Å of AuGe under 150Å of Ni. Similar layers 41 were deposited on the wafer's backside. Low resistivity ohmic contacts were formed using a rapid thermal anneal in a hydrogen ambient at 375° C. for 2.5 min.

In addition to serving as ohmic contacts, the topside metal 30 also served as a mask in an anisotropic reactive ion etch (RIE) step. The RIE system was a DRYTEK model DRIE-100 converted from a multiple cathode production system into a single cathode research system. The etch process was performed with $BCl_3$ at a flow rate of 60 std $cm^3$/min, in a chamber pressure of 190 mTorr, and at a self-bias potential of 546 V. This process was used to anisotropically etch the MBE material at a rate of 2225Å/min. Reasonable selectivity was maintained between the MBE material and the metal 30, producing a total etch depth of 4500Å.

Figure 3C:
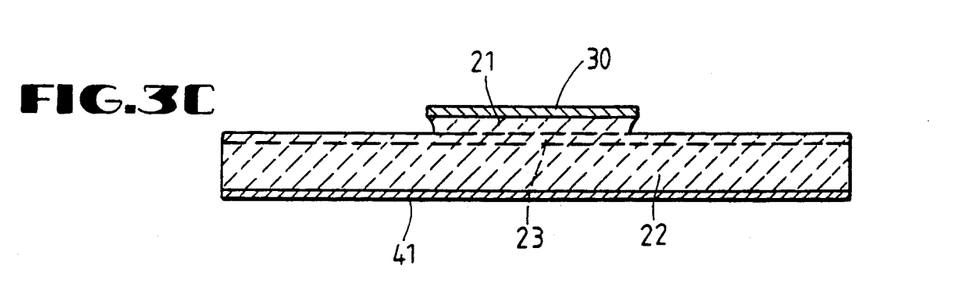
Figure 3D:
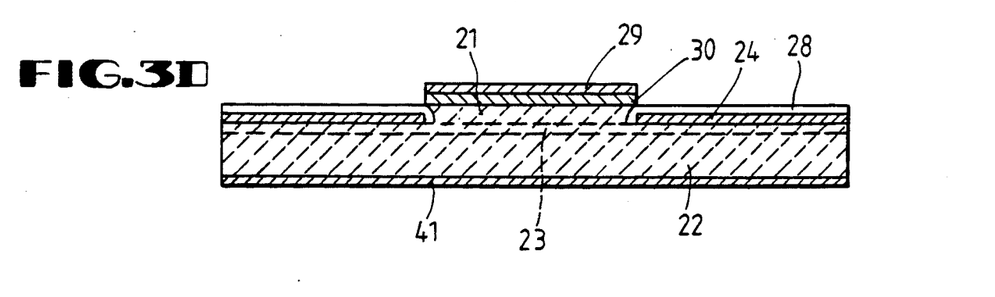

After the anisotropic reactive-ion etch, an isotropic liquid etch using a citric acid solution removed another 750Å of MBE material and created a slight undercut in the device mesa, as shown in FIG. 3C. This liquid etch step exposed the thin undoped well layer (27 in FIGS. 1 and 2) at the base of the mesa 21. A non-conformal deposition of chromium gate material 24 on the wafer's surface resulted in the self-aligned rectifying contact at the well region as shown in FIG. 3D. A layer 29 of chromium also became deposited on the top of the mesa.

Figure 3E:
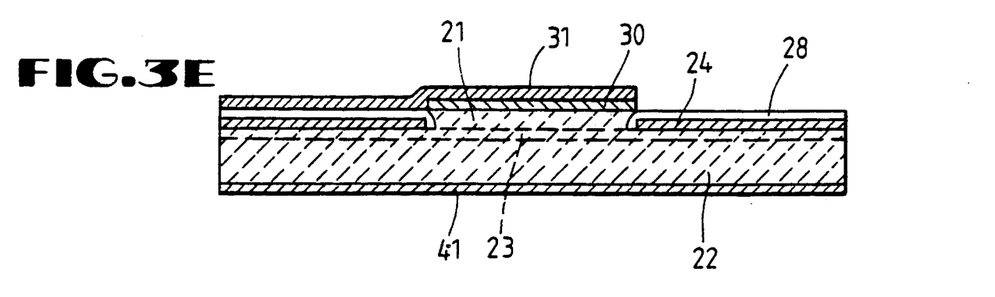

In order to make a drain contact to the top of the mesa, the wafer was planarized with polyimide and then etched back in a $O_2$ plasma barrel etcher until the surfaces of the drain ohmic contacts 30 were exposed. Image reversal contact photolithography followed by liftoff metallization was used to align, define, and deposit 100 μm by 100 μm pads 31 on each device array. The deposited metal consisted of 1000Å of Al followed by 500Å of Au. This served as the drain contact bond pad for packaging. The dielectric planarization coating 28 served the additional purpose of isolating the drain contact pad 31 from the underlying metal gate 24 (See FIG. 1). The resulting structure is shown in FIG. 3E. After this last step, all the devices in an array became electrically connected in parallel. Contact to the metal gate was made at a convenient point away from the device arrays.

Figure 4:
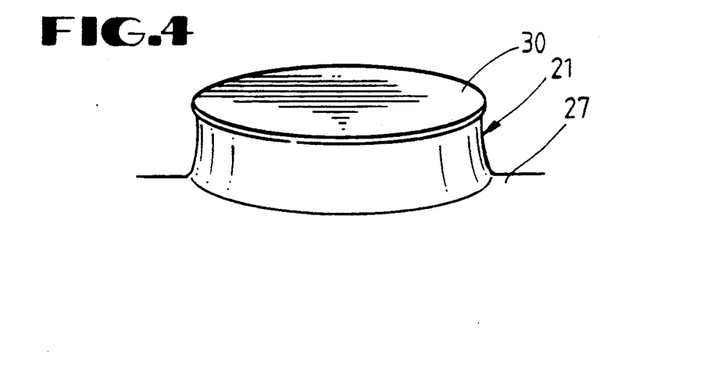
FIG. 4 is a pictorial view of a mesa that was obtained when fabricating an experimental GRTD according to the invention.

FIG. 4 shows a pictorial view of the etched mesa 21 after the anisotropic reactive ion and liquid etching. Note the unique undercut feature in the mesas. The top of the mesa 21 formed the drain ohmic contact 30. The base of the mesas provided the exposed undoped well regions 27. Therefore, after non-conformal deposition of chromium on the base, a good rectifying contact was formed near the tunneling barrier. The undercut in the mesas fulfilled the role of a shadow mask for the non-conformal chromium deposition and also assured electrical discontinuity between the drain ohmic contact 30 and the gate rectifying contact.

Figure 5:
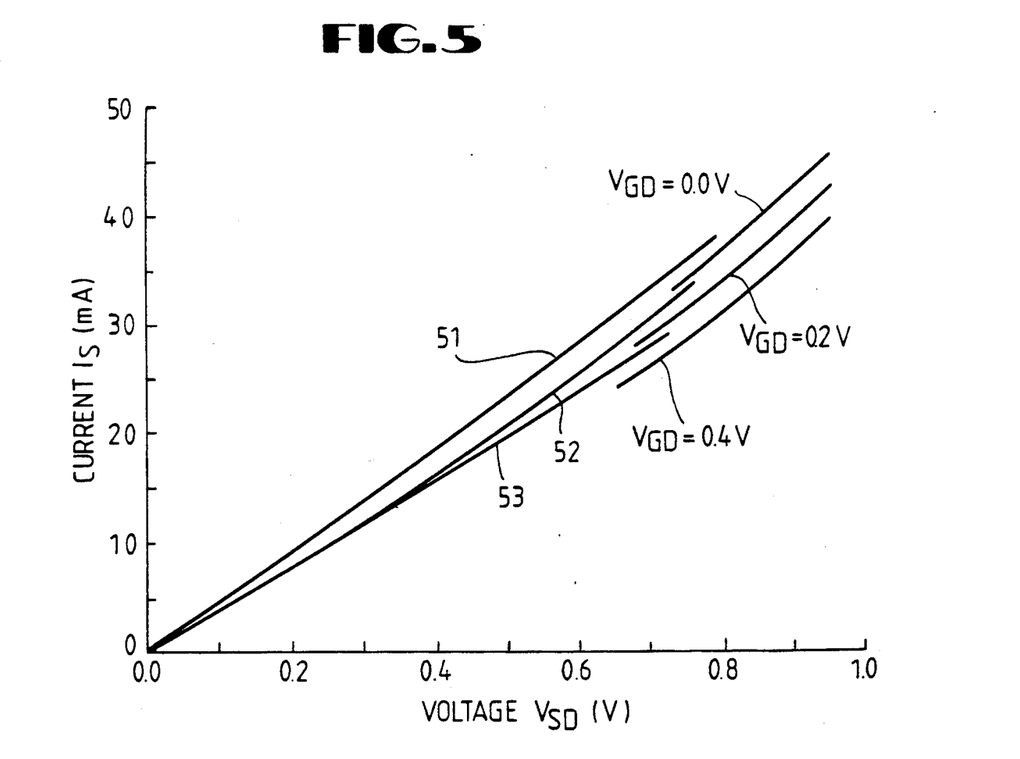
FIG. 5 is a graph of room temperature common drain characteristics of the experimental GRTD.

FIG. 5 shows the room temperature common drain characteristics ($I_s$ vs. $V_{SD}$) of the experimental GRTD for gate potentials between $V_{GD}=0.0$ V (top curve 51) and $V_{GD}=0.4$ V (bottom curve 53) as displayed by a transistor curve tracer. The middle curve 52 represents $V_{GD}=0.2$ V. The characteristics indicate that the GRTD functioned analogous to a P-channel FET, in which the metal gate is effectively "n" type and the intrinsic semiconductor is effectively "p" type in the Schottky junction between the gate and the undoped well region. The top curve 51 is a typical room temperature trace of a two terminal resonant tunneling diode. The discontinuities in the curves result from negative resistance in the actual current-voltage characteristic. Ideally, the tunneling current should be reduced without a shift in voltage when bias is applied to the gate of the GRTD to restrict the transport cross-section. This expected behavior could then be interpreted as evidence that the gate contact was totally rectifying and that no leakage current between gate and collector or gate and emitter was taking place.

From FIG. 5, it is clear that the application of the rectifying gate potential at the well region does very effectively constrict the cross-section available for current carriers through the vertical RTD. In addition, from the locations of the respective discontinuities in the curves 51, 52, 53, it is apparent that the application of a gate-to-drain potential greater than 0.4 V shifted the resonant bias of the vertical RTD by about 10%. The small departure for gate-to-collector potentials less than or equal to 0.4 V suggested that the injection of carriers from the gate into the "neutral" well region was negligible. However, for gate potentials greater than 0.4 V, appreciable injection of carriers occurred and this circumvented the effects of further depletion. It is believed that this latter behavior was partly due to inaccuracy and non-uniformity of the two step etch process which allowed the metal gate to make partial contact with the highly doped layers surrounding the thin undoped well region. Also, it should be possible to reduce the leakage current between the gate and drain or source by increasing the thickness of the undoped GaAs above and below the tunneling barrier.

Figure 6:
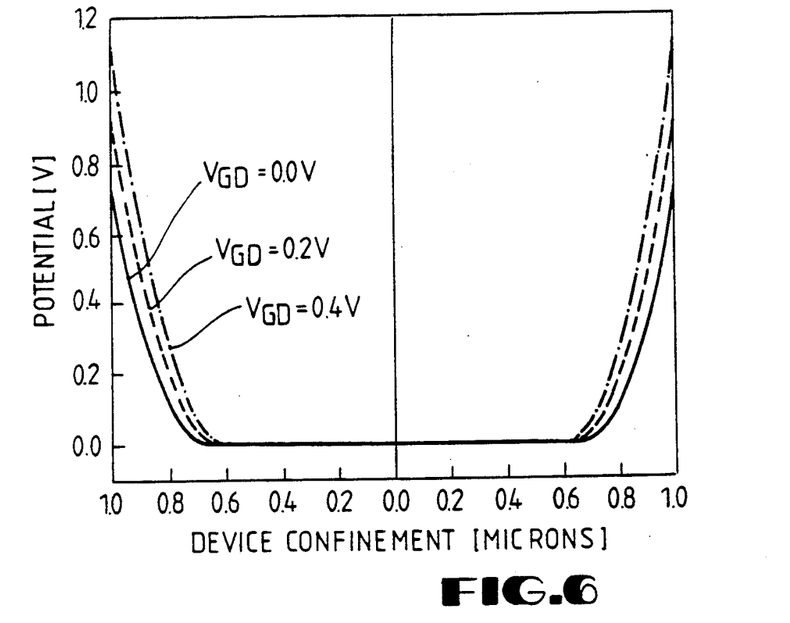
FIG. 6 is a graph of the computed lateral confining potential in the potential well between the tunneling double barrier of the experimental GRTD.

The conclusion that the control voltage on the gate controls the cross-sectional area available for the tunneling current carriers is supported by the calculated lateral confinement and constriction of the potential well between the tunneling double barrier as a function of the control voltage. Assuming homogeneous doping in the well, and axial symmetry in the gate and the well, Poisson's equation was solved to yield the lateral confining potential in the well. The results are shown in FIG. 6. In this plot the confining potentials for the three gate voltages used in the traces of FIG. 5 are shown. The consequent decrease in the tunneling cross-section verses gate potential is shown on the abscissa. These results indicate that the continuous constriction of the tunneling current channel will lead to zero-dimensional confinement of the tunneling carriers to shut off the tunneling current.

In practice, the deficiencies in the experimental results of FIG. 5 should also be avoided by shrinking the length, width and height of the mesa by about a factor of ten. The mesa diameters of 2 μm, 4 μm, and 6 μm were selected to permit fabrication of the experimental device by conventional optical photo-lithography. To achieve a comparable structure having a mesa diameter of 0.2 μm or less, the structure should be fabricated by electron-beam or X-ray photolithography. In this case a reduction in radial dimension of the mesa by a factor of ten should cause the channel of tunneling current to be pinched off ($I_s$ approximately zero) for $V_{GS}=0$ over the range of $V_{SD}=0.0$ V to 1.0 V depicted in FIG. 5.

Figure 7:
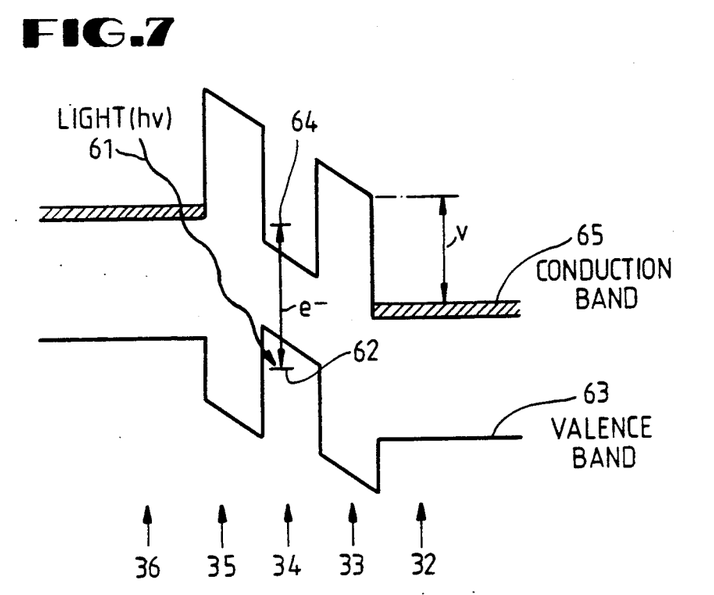
FIG. 7 is an energy level diagram of a GRTD used for detecting an optical signal.

Turning now to FIG. 7, there is shown an energy level diagram which illustrates the operation of a GRTD as an optical detector. By choosing the semiconductor material for optical transmission at a particular optical wavelength or bandwidth, the GRTD can function as a variable gain photonic device by allowing incident light to excite carriers from a hidden level 62 in the valance band 63 to a resonant conducting level 64 in the conduction band 65 of the well layer 34. With a suitable bias (v) between the drain and source of the GRTD, the tunneling current will be responsive to the amplitude of the incident light 61, the control voltage on the gate, and the product of amplitude of the incident light and the control voltage. Due to the product or "square-law" response, the GRTD can function as a synchronous optical detector by mixing the amplitude of the optical signal against a local oscillator signal supplied to the gate of the GRTD.

Figure 8:
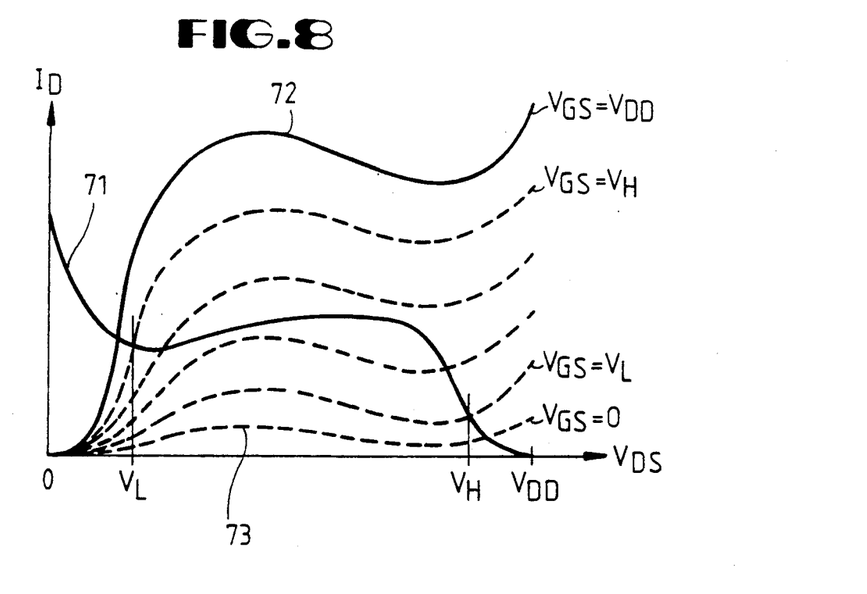
FIG. 8 is a graph of common source characteristics of a GRTD used as a logic inverter.

The GRTD could also be used in a logic gate. Shown in FIG. 8, for example, are the common source characteristics of a GRTD which is substantially cut off for $V_{GS}=0$. To function as an inverter, the GRTD is provided with a load resistance from its drain contact to a supply voltage $V_{DD}$. Preferably, the load resistance is nonlinear and is provided by a tunnel diode. In FIG. 8, for example, the nonlinear characteristic of the tunnel diode appears as a nonlinear load line 71. The load line 71 has a substantially flat or constant current section which falls between the GRTD characteristic curve 72 for the case of $V_{GS}=V_{DD}$, and the characteristic curve 73 for $V_{GS}=0$. The curves 72 and 73 correspond to the GRTD being turned on and being cut off, respectively. The load line 71 and the family of curves between the curves 72 and 73 determines a low logic level $V_L$ and a high logic level $V_H$ for the operation of the inverter.

Figure 9:
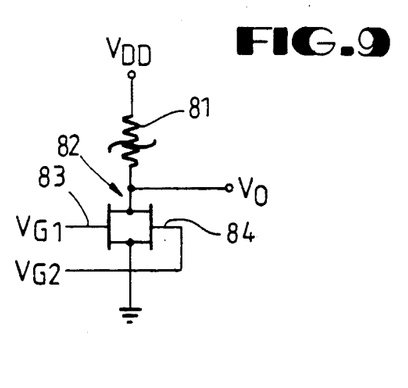
FIG. 9 is a schematic diagram of a GRTD used as a logic NOR gate.
Figure 10:
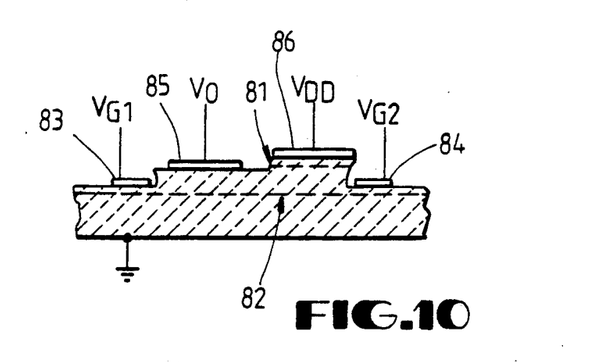
FIG. 10 is a cross-sectional view of the GRTD used as a logic NOR gate.
Figure 11:
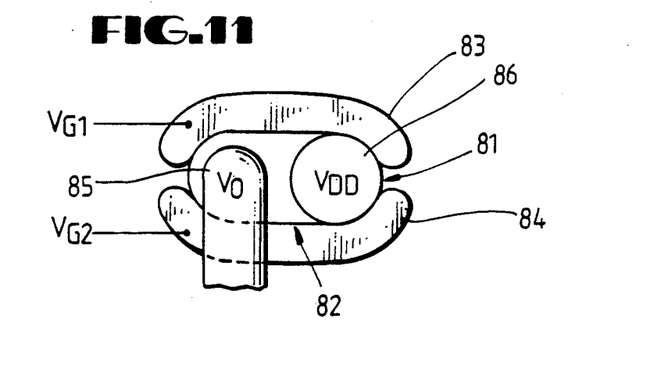
FIG. 11 is a plan view of the GRTD used as a logic NOR gate.

A logic gate operates in a fashion similar to an inverter, but requires the interconnection of at least two GRTDs, or a GRTD with at least two separate gate inputs. A logical NOR gate having two separate gate inputs, for example, is depicted in FIGS. 9 to 11. From the schematic diagram in FIG. 9, the tunnel diode load 81 is proportioned in relationship to the GRTD 82 so that the output $V_o$ will be at a logic high level $V_H$ only when both of the gate voltages $V_{G1}$ and $V_{G2}$ are at a logic low level $V_L$. In other words, the GRTD 82 will have its channel cut off only when depletion regions extend from both of the gates 83, 84.

As further shown in FIGS. 9 and 10, the logical NOR gate is fabricated as a vertical structure with the tunnel diode 81 on top of the GRTD 82. Preferably the tunnel diode 81 is formed by molecular beam epitaxy in the same fashion as the GRTD. Instead of having a single tunneling barrier, the substrate is formed with an additional tunneling barrier at the top of the mesa. Fabrication continues using the steps depicted in FIGS. 3A to 3E, with the exception that an additional etch step is required for etching a step in the top of the mesa to provide separate ohmic contacts 85 and 86 for the output $V_o$ and the supply connection $V_{VV}$. In practice, all of the supply contacts $V_{DD}$ would be interconnected to a power plane of metallization covering interconnect metallization runs between the outputs and gate inputs of various logic gates on the substrate.

In view of the above, there has been described a gated resonate tunneling diode in which the tunneling current is modulated by an electric field from the gate. A control voltage on the gate laterally constricts a potential well in the tunneling barrier to control the electrical size of a channel within which tunneling occurs across the tunneling barrier. The gated resonant tunneling diode is manufactured by a process causing the gate to be self-aligned with the tunneling barrier. The operation of the gated resonant tunneling diode is analogous to a junction field-effect transistor. To isolate the gate from the source and drain, the gate makes a rectifying Schottky junction in connection with the tunneling barrier layer. The electric field from the gate causes lateral depletion and constriction of the conduction channel including the tunneling barrier, so that the electric field modulates the tunneling current. The GRTD can be constructed so that the channel is not constricted for a gate-to-source voltage equal to the drain-to-source voltage, but is entirely constricted when the gate-to-source voltage is equal to zero. Therefore, logic gates are readily constructed from the gated resonate tunneling diodes. In particular, very compact vertical logic gate structures can be realized.

We claim:

1. A gated tunnel diode comprising, in combination: a plurality of parallel planar layers including a source layer; a drain layer; and a tunneling double-barrier layer separating said source layer and said drain layer and defining a planar potential well between said source layer and said drain layer for confining tunneling current carriers tunneling between said source layer and said drain layer in a direction perpendicular to said layers, and gate means for constricting said planar potential well in a lateral direction parallel to said planar potential well in response to said control voltage to substantially reduce the lateral area of said planar potential well existing between said source layer and said drain layer and thereby substantially reduce said tunneling current.

2. The gated tunnel diode as claimed in claim 1, wherein said tunneling double-barrier layer includes a semiconductor double heterojunction.

3. A gated tunnel diode comprising, in combination: a plurality of parallel planar layers including a source layer; a drain layer; and a tunneling double-barrier layer separating said source layer and said drain layer and defining a planar potential well between said source layer and said drain layer for confining tunneling current carriers tunneling between said source layer and said drain layer in a direction perpendicular to said layers, and gate means for constricting said planar potential well in a lateral direction parallel to said planar potential well in response to said control voltage to substantially reduce the lateral area of said planar potential well existing between said source layer and said drain layer and thereby substantially reduce said tunneling current, wherein said gate means includes an electrically conductive gate surrounding a channel region of said tunneling double-barrier layer for constricting said potential well in a radial direction.

4. A gated tunnel diode comprising, in combination: a plurality of parallel planar layers including a source layer; a drain layer; and a tunneling double-barrier layer separating said source layer and said drain layer and defining a planar potential well between said source layer and said drain layer for confining tunneling current carriers tunneling between said source layer and said drain layer in a direction perpendicular to said layers, and gate means for constricting said planar potential well in a lateral direction parallel to said planar potential well in response to said control voltage to substantially reduce the lateral area of said planar potential well existing between said source layer and said drain layer and thereby substantially reduce said tunneling current, wherein said tunneling double-barrier layer consists of semiconductor material, and said gate means includes a metallic gate which makes a Schottky-metal semiconductor junction with said tunneling double-barrier layer.

5. A gated tunnel diode comprising, in combination:
a plurality of parallel planar layers including a source layer; a drain layer; and a tunneling double-barrier layer separating said source layer and said drain layer and defining a planar potential well between said source layer and said drain layer for confining tunneling current carriers tunneling between said source layer and said drain layer in a direction perpendicular to said layers, and gate means for constricting said planar potential well in a lateral direction parallel to said planar potential well in response to said control voltage to substantially reduce the lateral area of said planar potential well existing between said source layer and said drain layer and thereby substantially reduce said tunneling current, wherein one of said source and drain layers is formed as a mesa upon the tunneling double-barrier layer, said mesa has an undercut wall and a top portion overhanging said undercut wall, and said gate means includes a gate layer that is disposed about the base of said mesa and is aligned with the top portion of said mesa.

6. A gated resonant tunneling diode comprising a planar semiconductor substrate, a semiconductor mesa above said substrate, a tunneling barrier layer separating said mesa from said substrate, and at least one gate layered over said substrate about said mesa and aligned in close proximity to said tunneling barrier layer, wherein said gate is metallic and makes a Schottky metal-semiconductor rectifying junction in connection with said tunneling barrier layer.

7. The gated resonant tunneling diode as claimed in claim 6, wherein said tunneling barrier layer includes a double-barrier heterostructure.

8. The gated resonant tunneling diode as claimed in claim 7, wherein said double-barrier heterostructure is unipolar.

9. The gated resonant tunneling diode as claimed in claim 6, wherein the gate is disposed at the base of said mesa.

10. The gated resonant tunneling diode as claimed in claim 6, wherein said gate is disposed over at least a portion of said tunneling barrier layer.

11. The gated resonant tunneling diode as claimed in claim 6, wherein said mesa has an undercut wall and a top portion overhanging said undercut wall, sand said gate is aligned with the top portion of said mesa.

12. A gated resonant tunneling diode comprising a planar semiconductor substrate, a semiconductor mesa above said substrate, a tunneling barrier layer separating said mesa from said substrate, and at least one gate layered over said substrate about said mesa and aligned in close proximity to said tunneling barrier layer, wherein said mesa has an undercut wall and a top portion overhanging said undercut wall, and said gate is aligned with the top portion of said mesa.

13. The gated resonant tunneling diode as claimed in claim 12, wherein said gate is metallic and forms a Schottky metal-semiconductor junction with an intrinsic semiconductor layer over said tunneling barrier layer.

14. The gated resonant tunneling diode as claimed in claim 12, wherein said tunneling barrier layer includes a unipolar double-barrier heterostructure.

15. The gated resonant tunneling diode as claimed in claim 12, wherein said substrate and said mesa consist of gallium arsenide.

* * * * *